United States Patent [19]
Rothenberg

[11] Patent Number: 5,880,690
[45] Date of Patent: Mar. 9, 1999

[54] PIPELINE ADC COMMON-MODE TRACKING CIRCUIT

[75] Inventor: Bret C. Rothenberg, Los Altos, Calif.

[73] Assignee: Exar Corporation, Fremont, Calif.

[21] Appl. No.: 892,401

[22] Filed: Jul. 15, 1997

[51] Int. Cl.[6] .................................................. H03M 1/42
[52] U.S. Cl. .......................................... 341/161; 330/258
[58] Field of Search ................................... 341/161, 162, 341/163; 330/258

[56] References Cited

U.S. PATENT DOCUMENTS

| | | | |
|---|---|---|---|
| 4,697,152 | 9/1987 | Westwick | 330/9 |
| 4,906,943 | 3/1990 | Koch | 330/258 |
| 5,212,455 | 5/1993 | Pernici et al. | 330/253 |
| 5,359,294 | 10/1994 | Ganger et al. | 330/258 |

*Primary Examiner*—Marc S. Hoff
*Attorney, Agent, or Firm*—Townsend and Townsend and Crew LLP

[57] ABSTRACT

A common-mode feedback circuit which calculates the common-mode signal at each stage of a pipeline ADC, rather than calculating it globally and distributing it. The local calculation thus provides a local interpolation between the positive and negative voltage reference, and also provides a mechanism for storing the interpolated charge for application to the common-mode feedback input of the amplifier.

5 Claims, 3 Drawing Sheets

5,880,690

PIPELINE ADC COMMON-MODE TRACKING CIRCUIT

BACKGROUND OF THE INVENTION

The present invention relates to a circuit which causes a differential op-amp common-mode output level to track a DACs common-mode level, and in particular to such circuits for use in a pipeline analog-to-digital converter (ADC).

In fully differential circuits, it is desirable to avoid variations in the common-mode component of differential signals. This is especially true in high resolution ADCs. A 1.5b/stage pipeline ADC, typically uses a switched digital-to-analog converter (DAC) in each stage to supply the required reference voltages that are used in the algorithm for the given stage. This switched DAC reference voltage is applied to the input of an op-amp. The op-amp is biased to accept a common-mode input at the same level as the common-mode output level of the previous stage. In addition, the op-amp typically has a limited common-mode rejection ratio (CMRR), and common-mode input range (CMIR). To minimize the variation in the common-mode component of these two inputs, it would be helpful to have the common-mode output level of the previous stage track the common-mode level of the DAC. Further, it would be helpful if this tracking function could be done without requiring any additional external decoupling capacitors. (Two decoupling capacitors are usually required for a positive DAC reference voltage (Vdacp) and a negative DAC reference voltage (Vdacn)). Also, it is helpful for this circuit to be insensitive to wire resistance, and for this circuit to track any high frequency variations in the common-mode DAC voltage.

SUMMARY OF THE INVENTION

The present invention provides a common-mode feedback circuit which capacitively interpolates the common-mode DAC signal at each stage of the pipeline, rather than resistively calculating it globally and distributing it, and sets the op-amp output equal to this interpolated voltage.

In the preferred embodiment, two capacitors are coupled in series with their common node connected to the CMFB input, and their other nodes connected to the positive and negative outputs of the amplifier. A first phase clock and switching circuit selectively couples the capacitors to the positive and negative outputs. A second switching circuit, and a second phase clock selectively couples the capacitors to the global positive and negative DAC voltage supplies. The common node of the capacitors is selectively connected by the second phase clock to the 0 input reference level of the common-mode op-amp. Thus, the two capacitors locally interpolate between the positive and negative voltages to generate the desired common-mode output level for the op-amp.

For a further understanding of the nature and advantages of the invention, reference should be made to,-the following description taken in conjunction with the accompanying drawings.

DESCRIPTION OF THE PREFERRED EMBODIMENT

Figure 1:
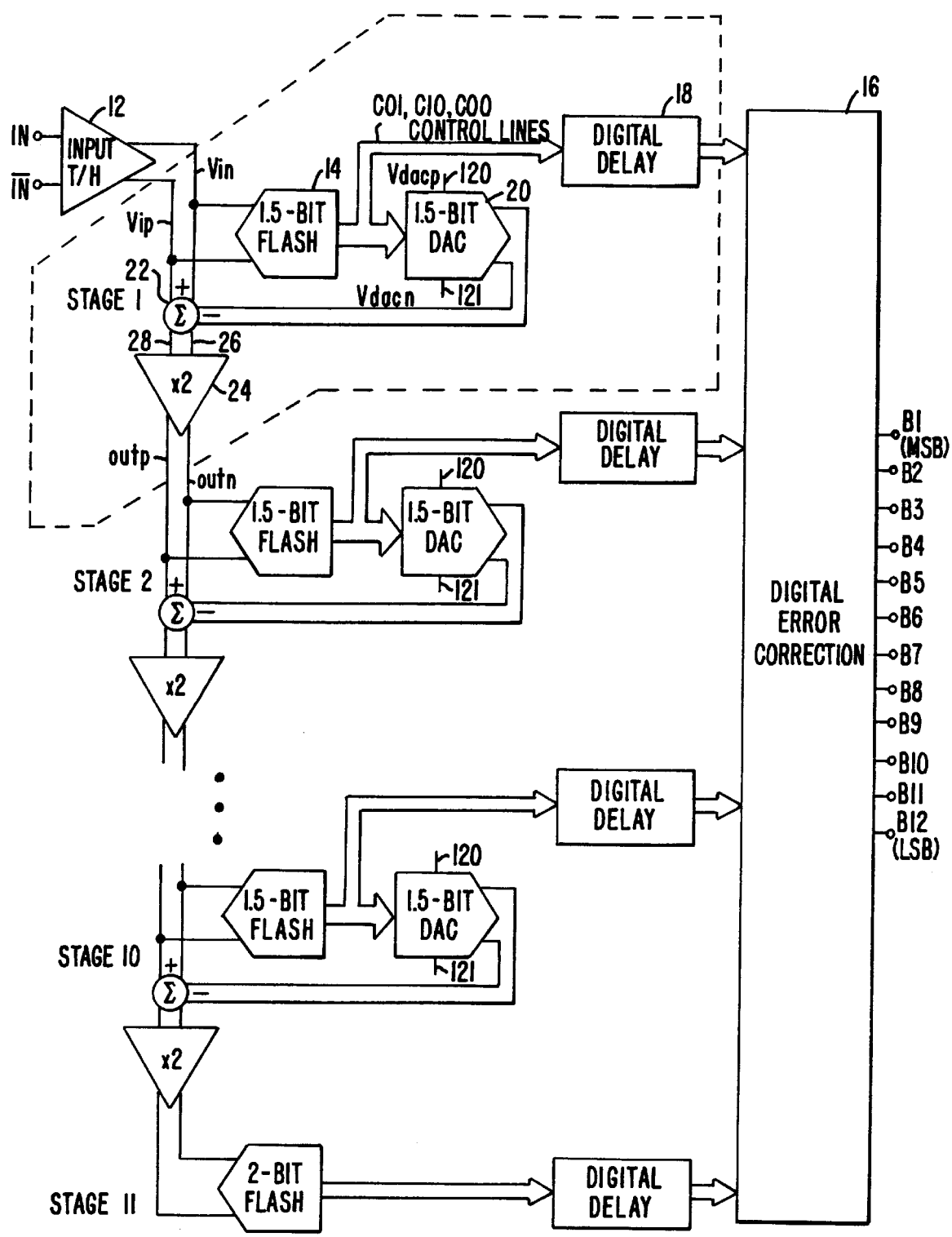
FIG. 1 is a block diagram of an illustrative prior art ADC.

FIG. 1 illustrates a typical prior art multi-stage pipeline ADC. A differential input is provided through an input buffer 12. The differential lines from the buffer are applied to a 1.5-bit flash circuit 14 for determining 1.5 bits of the eventual digital result. The extra ½ bit is used for digital error correction by circuit 16 after passing through a digital delay 18. Accordingly, the ADC is commonly referred to as a 1.5 bit/stage converter. A 1.5-bit digital-to-analog converter 20 is also provided in each stage to generate a required reference voltage. Essentially, this can be thought of as converting the digital estimate back into analog form to subtract it from the original signal in a summing circuit 22. The output of the summing circuit is then supplied to a multiplying amplifier 24 which amplifies the signal by a factor of 2 so that the residue can be presented in the same voltage range as an original signal to the next stage.

Figure 2:
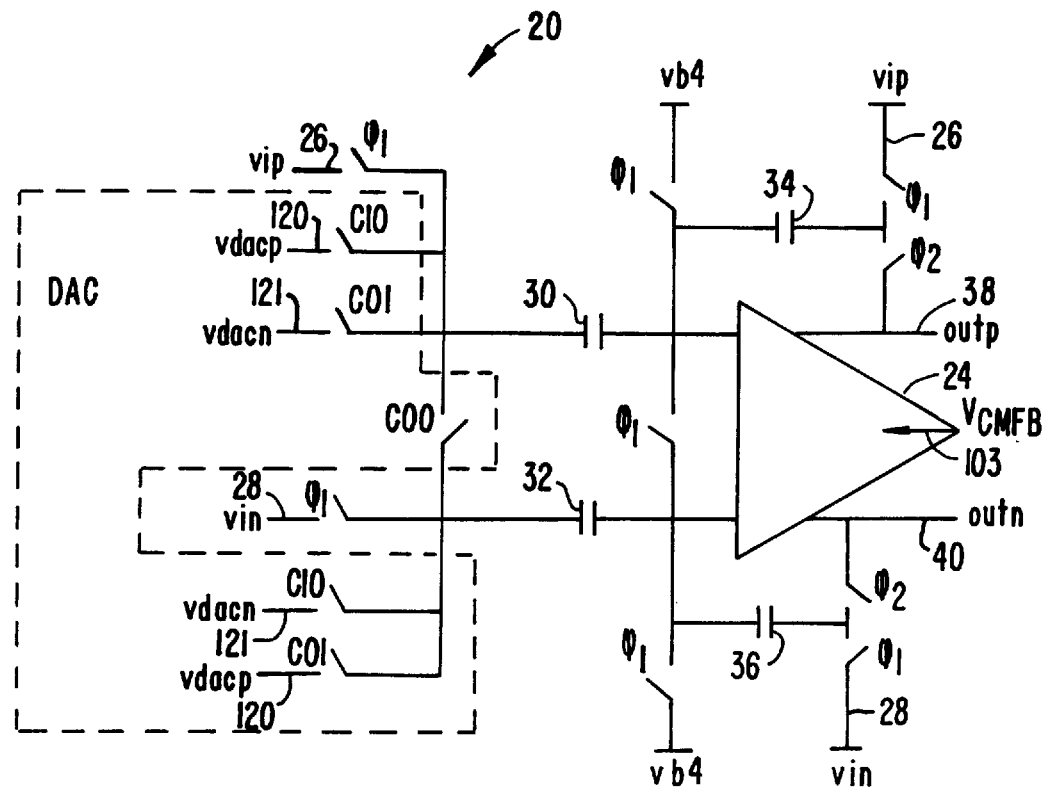
FIG. 2 is a diagram of a prior art DAC and amplifier in one stage of an ADC such as that in FIG. 1.

FIG. 2 illustrates the circuitry for a typical DAC 20, summer 22, and amplifier 24 of FIG. 1.

FIG. 2 is a circuit diagram of DAC 20 and amplifier 24, and summer 22. In operation, during a first phase, the phase 1 clock $\phi_1$ is applied. The phase 1 clock connects the input voltage positive and negative signals (Vip, Vin) on lines 26 and 28 to capacitors 30, 34, and 32, 36, respectively. The other side of the capacitors are connected to reference voltage Vb4. Vb4 is the optimum common-mode Input level for the op-amp.

During a second phase of the clock, the $\phi_2$ clock signal closes the switches shown, with the $\phi_1$ switches being opened. Thus, the voltages on the capacitors 34 and 36 are connected to the outputs on lines 38 and 40, outp and outn. During this second phase, the 1.5-bit analog-to-digital conversion is produced by a circuit such as flash circuit 14 of FIG. 1. The flash circuit includes two comparators and logic which generate the 1.5-bit=3 value clock signals C10, C00, C01. These clock signals are applied to the switches as shown in FIG. 2, which compose the local DAC. Three DAC outputs are possible +Vdac, 0, and −Vdac. Vdacp is the positive voltage reference for the entire ADC. Vdacn is the global negative reference.

In the following descriptions, we use the following definitions:

$$Vid \equiv Vip - Vin$$

$$Vic \equiv \frac{Vip + Vin}{2}$$

$$Vdacd \equiv Vdacp - Vdacn$$

$$Vdacc \equiv \frac{Vdacp + Vdacn}{2}$$

where the following reference numbers are used in the figures:

Vip=26
Vin=28
Vdacp=120
Vdacn=121

The control clocks select either Vdacd+Vdacc, 0+Vic, or-Vdacd+Vdacc to be applied, respectively. Vic is the common-mode input from the previous stage. Vdacd is the global differential dac voltage, and Vdacc is the global common-mode DAC voltage.

It can be seen that if C01 or C10 is selected, a common-mode voltage of Vic-Vdacc is applied at the op-amp input. If Vic is not equal to Vdacc, then there is a residual common-mode voltage that is applied to the op-amp input. If this residual voltage is large, and the common-mode input range of the op-amp is small, then the accuracy of the stage may be affected. The result of this residual voltage may exceed the common-mode input range of the op-amp causing the op-amp open loop gain to drop or it may cause the CMRR of the op-amp to drop. Finally, if the op-amp does not have good CMRR then the DAC 0 voltage point may not be properly interpolated.

Figure 3:
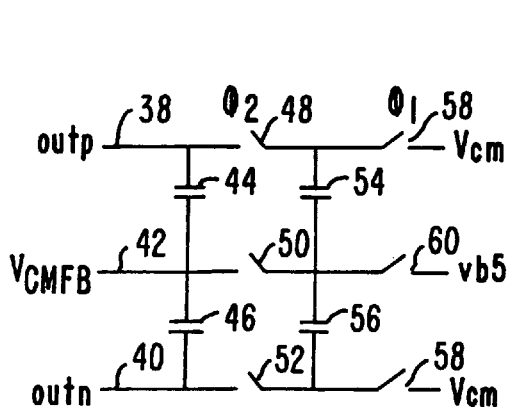
FIG. 3 is a circuit diagram of a typical prior art CMFB circuit.

FIG. 3 is circuit diagram of a typical prior art CMFB circuit. The outputs 38 and 40 of amplifier 24 are shown, along with the common-mode feedback input ($V_{CMFB}$) on line 42. These connect across two capacitors 44 and 46. Three switches 48, 50, and 52 connect these signals during phase 2 across capacitors 54 and 56. During phase 1, three switches 58, 60, and 62 connect capacitors 54 and 56 to the common-mode voltage ($V_{CM}$) and an intermediate reference voltage Vb5 which is equal to the zero level of the common-mode op-amp input 103.

Figure 4:
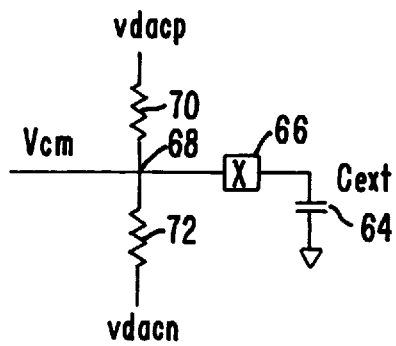
FIG. 4 is a diagram of a typical prior art circuit for generating a global common-mode voltage.

In a typical prior art circuit, the common-mode voltage ($V_{CM}$) is generated globally by a circuit shown in FIG. 4. An external capacitor 64 connects via a chip pad 66 to a node 68 which is coupled between the positive ADC reference voltage Vdacp and the negative ADC reference voltage Vdacn by resistors 70 and 72, respectively. These resistors perform an interpolation function, and generate the common-mode voltage, $V_{CM}$. This signal line is then routed to each of the stages to provide the respective $V_{CM}$ signals such as shown on line 58 in FIG. 3. This voltage Vcm is used with switched capacitor common-mode feedback (SC CMFB) to set Vic to be equal to Vdacc. There are several drawbacks to this approach. The first disadvantage is that the buffer that generates Vdac voltages must be able to drive a resistive load. This takes additional dc drive current, and can be more difficult to construct. Also, since a large, high-speed switched capacitive load is applied to this node voltage, typically an external decoupling capacitor is required. Finally, since the time constant of this node does not track the time constant of the Vdacp and Vdacn nodes, it is possible that in a transient sense Vdacc and Vic do not track.

Figure 5:
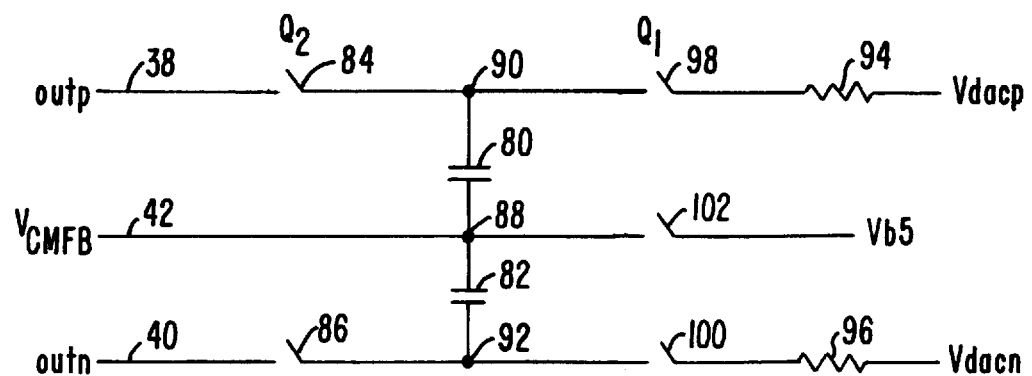
FIG. 5 is a diagram of a common-mode feedback circuit according to the present invention.

The present invention shows a CMFB circuit for each stage as set forth in FIG. 5. Here, capacitive interpolation is used to directly force Vic to be equal to Vdacc. This is done with a modification to the switched-capacitor common-mode feedback circuit of FIG. 3. The circuit is configured to act as a sample-and-hold circuit and interpolator, causing Vic to track Vdacc very closely at all frequencies. This circuit also overcomes the disadvantages of the resistive generation of Vic globally.

In particular, FIG. 5 shows outputs 38 and 40 connected directly to capacitors 80 and 82 through phase 2 switches 84 and 86, respectively. The CMFB op-amp input is directly connected to a common node 88 of the two capacitors. The other nodes 90 and 92 are connected to the outputs during phase 2, but are connected directly to the global positive reference voltage (Vdacp) and the negative voltage reference (Vdacn) of FIG. 4 and phase 1 switches 98 and 100. Common node 88 is connected to an intermediate voltage reference Vb5 through another phase 1 switch 102. The present invention thus locally, in each stage, interpolates between Vdacp and Vdacn, rather than doing it globally as in FIG. 4 to produce a $V_{cM}$ signal. This overcomes a number of disadvantages of the resistive generation shown in FIG. 4.

There is only a capacitive load on the buffer that drives the Vdacp and Vdacn nodes, simplifying buffer design. A decoupling capacitor for Vcm of FIG. 4 is not required, thus saving an additional external decoupling capacitor and pad. The time constant of Vdacc precisely tracks that of Vic, forcing them to match under transient conditions. Parasitic matched resistance between global Vdacp and switch 98, and global Vdacn and switch 100 does not cause an error in the generated Vic voltage.

As will be understood by those of skill in the art, the present invention may be embodied in other specific forms without departing from the spirit or essential characteristics thereof. Accordingly, the foregoing description is intended to be illustrative, but not limiting, of the scope of the invention which is set forth in the following claims.

What is claimed is:

1. A common mode feedback circuit for a stage of a differential, pipelined analog to digital converter having a global positive reference voltage and a global negative reference voltage, said stage including a digital to analog converter and an amplifier, comprising:

a first capacitor coupled between a first node and a common mode feedback (CMFB) input of said stage;

a second capacitor coupled between a second node and said CMFB input;

a first switch, controlled by a first phase clock, coupled between a positive output of said stage and said first node;

a second switch, controlled by said first phase clock, coupled between a negative output of said stage and said second node;

a third switch, controlled by a second phase clock, coupled between said first node and said global positive reference voltage;

a fourth switch, controlled by said second phase clock, coupled between said second node and said global negative reference voltage; and a fifth switch, controlled by said second phase clock, coupled between said CMFB input and a voltage reference.

2. The circuit of claim 1 further comprising:

a first resistor coupled between said third switch and said global positive voltage supply; and a second resistor coupled between said fourth switch and said global negative voltage supply.

3. A differential, pipelined, analog to digital converter comprising:

a plurality of stages, each stage having a digital to analog converter and an amplifier with a common mode feedback input;

a global positive reference voltage;

a global negative reference voltage;

a plurality of local circuits, each coupled to one of said stages, for providing a local interpolation between said global positive reference voltage and said global negative reference voltage and storing an interpolated charge for application to said common mode feedback input.

4. The analog to digital converter of claim 3 wherein each said local circuit comprises:

first and second capacitors having a common node coupled to said common mode feedback circuit;

a first clock switching circuit for connecting positive and negative outputs of said amplifier to non-common terminals of said first and second capacitors; and a second clock switching circuit for connecting said global positive and negative reference voltages to said non-common terminals.

5. The analog to digital converter of claim 3 wherein each local circuit comprises:
- a first capacitor coupled between a first node and a common mode feedback (CMFB) input of said stage;
- a second capacitor coupled between a second node and said CMFB input;
- a first switch, controlled by a first phase clock, coupled between a positive output of said stage and said first node;
- a second switch, controlled by said first phase clock, coupled between a negative output of said stage and said second node;
- a third switch, controlled by a second phase clock, coupled between said first node and said global reference voltage;
- a fourth switch, controlled by said second phase clock, coupled between said second node and said global negative reference; and
- a fifth switch, controlled by said second phase clock, coupled between said CMFB input and a voltage reference.

* * * * *